United States Patent [19]
Kano et al.

[11] Patent Number: 5,544,411
[45] Date of Patent: Aug. 13, 1996

[54] AUTOMATIC ELECTRONIC PARTS-MOUNTING APPARATUS

[75] Inventors: Yoshinori Kano; Masayuki Mohara, both of Ooizumi-machi, Japan

[73] Assignee: Sanyo Electric Co., Ltd., Moriguchi, Japan

[21] Appl. No.: 246,760

[22] Filed: May 20, 1994

[30] Foreign Application Priority Data

May 26, 1993 [JP] Japan ................................. 5-124320

[51] Int. Cl.$^6$ .................................................. B23P 19/04
[52] U.S. Cl. .................. 29/740; 29/743; 29/DIG. 44; 414/737
[58] Field of Search ........................... 29/740, 741, 743, 29/DIG. 44; 414/737, 738

[56] References Cited

U.S. PATENT DOCUMENTS

| | | | |
|---|---|---|---|
| 4,372,802 | 2/1983 | Harigane et al. | 29/743 X |
| 4,793,707 | 12/1988 | Hata et al. | 39/759 X |
| 4,951,388 | 8/1990 | Eguchi et al. | 29/740 X |
| 5,184,397 | 2/1993 | Hidese | 29/740 |
| 5,195,235 | 3/1993 | Mifuji | 29/740 X |

FOREIGN PATENT DOCUMENTS

| | | |
|---|---|---|
| 293175 | 11/1988 | European Pat. Off. . |
| 401808 | 12/1990 | European Pat. Off. . |
| 3-52299 | 3/1991 | Japan . |
| 3-78295 | 4/1991 | Japan . |
| 5-13993 | 1/1993 | Japan . |
| 5-82998 | 4/1993 | Japan ........................................ 29/743 |
| 1010736 | 4/1983 | U.S.S.R. .................................. 29/743 |

*Primary Examiner*—Peter Vo
*Attorney, Agent, or Firm*—Oliff & Berridge

[57] ABSTRACT

An automatic electronic parts-mounting apparatus mounts chip-like electronic parts supplied from a parts feeder at predetermined positions on a printed substrate. The parts-mounting apparatus accurately and quickly determines angular positions of the electronic parts by rotating adsorptive nozzles. The adsorptive nozzles are capable of adsorbing the electronic parts one by one, and each nozzle is connected to a rotor of a nozzle-rotating motor for rotating the adsorptive nozzle within a plane that is perpendicular to an axis of the adsorptive nozzle. The rotor is rotated in accordance with the adsorbed state of the electronic parts to make fine adjustment for determining the angular position.

12 Claims, 6 Drawing Sheets

|   | R-NO | X | Y | θ | C |
|---|---|---|---|---|---|
| 1 | 1 | X1 | Y1 | 90 |   |
| 2 | 2 | X2 | Y2 | 45 |   |
| 3 | 3 | X3 | Y3 | 30 |   |
| \| | \| | \| | \| | \| |   |
| \| | \| | \| | \| | \| |   |
| \| | \| | \| | \| | \| |   |
| N | --- | --- | --- | --- | E |

Fig. 5

AUTOMATIC ELECTRONIC PARTS-MOUNTING APPARATUS

BACKGROUND OF THE INVENTION

1. Field of the Invention

The present invention relates to an automatic electronic parts-mounting apparatus for taking electronic parts out of a parts feeder by use of an adsorptive nozzle, also known as a suction nozzle and determining an angular position of the electronic parts by the rotation of the adsorptive nozzle to mount them on a printed substrate.

2. Description of the Related Art

As a conventional technique for automatically and continuously mounting electronic parts on a printed substrate during manufacturing processes, parts being supplied one by one from a parts feeder or the like are adsorbed by an adsorptive nozzle composed of a vacuum pump and magnets etc., so as to be mounted at predetermined positions on the printed substrate. The electronic parts from the parts feeder are regularly transferred through, for example, a guide channel. However, there is an unavoidable slight deviation between the central axis and the feeding-out direction of the electronic parts. Due to this deviation, there would arise such problems that the electronic parts cannot be mounted at precise positions on the printed substrate even if they have been adsorbed in a constant state by the adsorptive nozzle, and that they could interfere with other electronic parts thereon.

Therefore, in an automatic electronic parts-mounting apparatus as disclosed in Japanese Patent Laid-Open No. Hei 3-52299, an adsorptive nozzle takes the electronic parts out of a parts feeder by adsorption in an adsorptive station, and a recognizing device recognizes the positional deviation of the electronic parts. Based on the recognized result, a nozzle rotation-positioning device rotates the adsorptive nozzle to determine the angular position. The electronic parts are then mounted on the printed substrate in a parts-mounting station. The nozzle rotation-positioning device does not move relatively to a rotary disc for moving the nozzle between the aforementioned stations. Namely, after the nozzle comes to and stops at the front of the positioning device by rotation, the positioning device rotates the nozzle to make a fine adjustment.

According to such a conventional technique, however, the adsorptive nozzle stops at a position of the positioning device for fine adjustment by its rotation, which would require a certain time for completion of the stopping action, thereby undesirably increasing the production time for mounting the electronic parts. Meanwhile, if it is intended to reduce the stopping time, this would make it difficult to perform the positioning precisely.

To cope with such a problem, there is known a technique in which a mechanism for rotating the nozzle itself is mounted on the head section for moving the nozzle, as disclosed in Japanese Patent Laid-Open No. Hei 3-78295. In this case, however, since the nozzle is rotated by being linked with an output shaft of the motor mounted on the head section through an intermediate member such as a belt, there would arise lost motion of the rotary transmission system which would impede accurate operation for angular positioning.

SUMMARY OF THE INVENTION

It is therefore an object of this invention to provide an automatic electronic parts-mounting apparatus which is capable of performing highly accurate angular positioning by rotating an adsorptive nozzle.

In view of the above-mentioned object, an automatic electronic parts-mounting apparatus of this invention comprises: an adsorptive nozzle for adsorbing the electronic parts one by one; an adsorptive mechanism for adsorbing or releasing the electronic parts to or from said adsorptive nozzle; a part-adsorbing station for holding the electronic parts supplied from a parts feeder; a parts-recognizing station for recognizing the state of the electronic parts having been adsorbed by the nozzle in said parts-adsorbing station; a parts-mounting station for holding the printed substrate on which the electronic parts adsorbed by the adsorptive nozzle are to be mounted; a nozzle head having a nozzle-rotating motor for correcting the position of the adsorbed electronic parts by rotating said adsorptive nozzle within a plane being perpendicular to the nozzle axis of said adsorptive nozzle in accordance with the adsorbed state of the electronic parts recognized in said parts-recognizing station, the nozzle rotating motor including a stator and a rotor having at least one adsorptive nozzle; a movable base including said nozzle head for sequentially moving said nozzle heads toward the stations; and a head up/down mechanism for vertically moving the nozzle head having been moved to a station at a predetermined position by said movable base toward an electronic parts-adsorbing or releasing position.

Namely, the state of the electronic parts having been adsorbed by the adsorptive nozzle is recognized in the parts-recognizing station. At this time, the rotating-positional deviation of the electronic parts on the plane being perpendicular to the axis of the adsorptive nozzle is recognized. The adsorptive nozzle is directly mounted on the rotor of the nozzle-rotating motor. The rotor of the nozzle-rotating motor rotates on the basis of the recognized result of the parts-identifying station to make the adsorptive nozzle rotate and to correct the angular position of the electronic parts. The thus angular position-corrected electronic parts are then mounted at predetermined positions on the printed substrate.

Accordingly, it is understood that the adsorptive nozzle having adsorbed the electronic-parts can rotate, without any loss, just by an angle that the rotor of the nozzle-rotating motor has rotated. Further, since the adsorptive nozzle can correct its angular position by the rotation of the rotor while the adsorptive nozzle moves between the stations, there will be no need to stop the adsorptive nozzle for correcting its angular position, leading to an efficient parts-mounting operation without increasing the production time.

The above and other objects, features and advantages of the present invention will become clear from the following description of the preferred embodiment thereof, taken in conjunction with the accompanying drawings.

BRIEF DESCRIPTION OF THE DRAWINGS

FIG. 5 is an explanatory view of NC data of an automatic electronic parts-mounting apparatus according to this invention;

DETAILED DESCRIPTION OF THE PREFERRED EMBODIMENTS

An embodiment of this invention will now be described with reference to the accompanying drawings.

Figure 1:
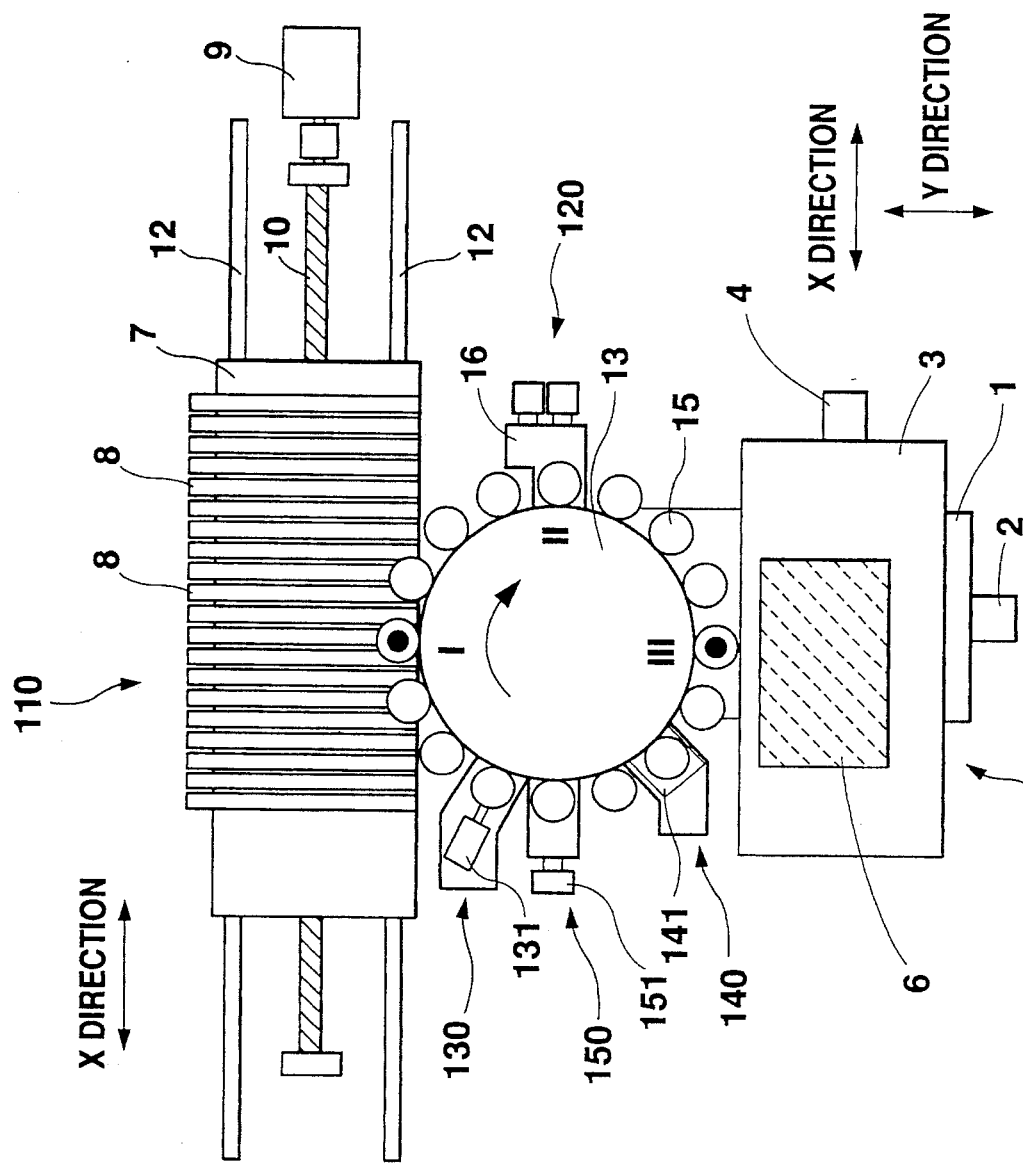
FIG. 1 is a schematic plan view showing an automatic electronic parts-mounting apparatus according to this invention.
Figure 2:
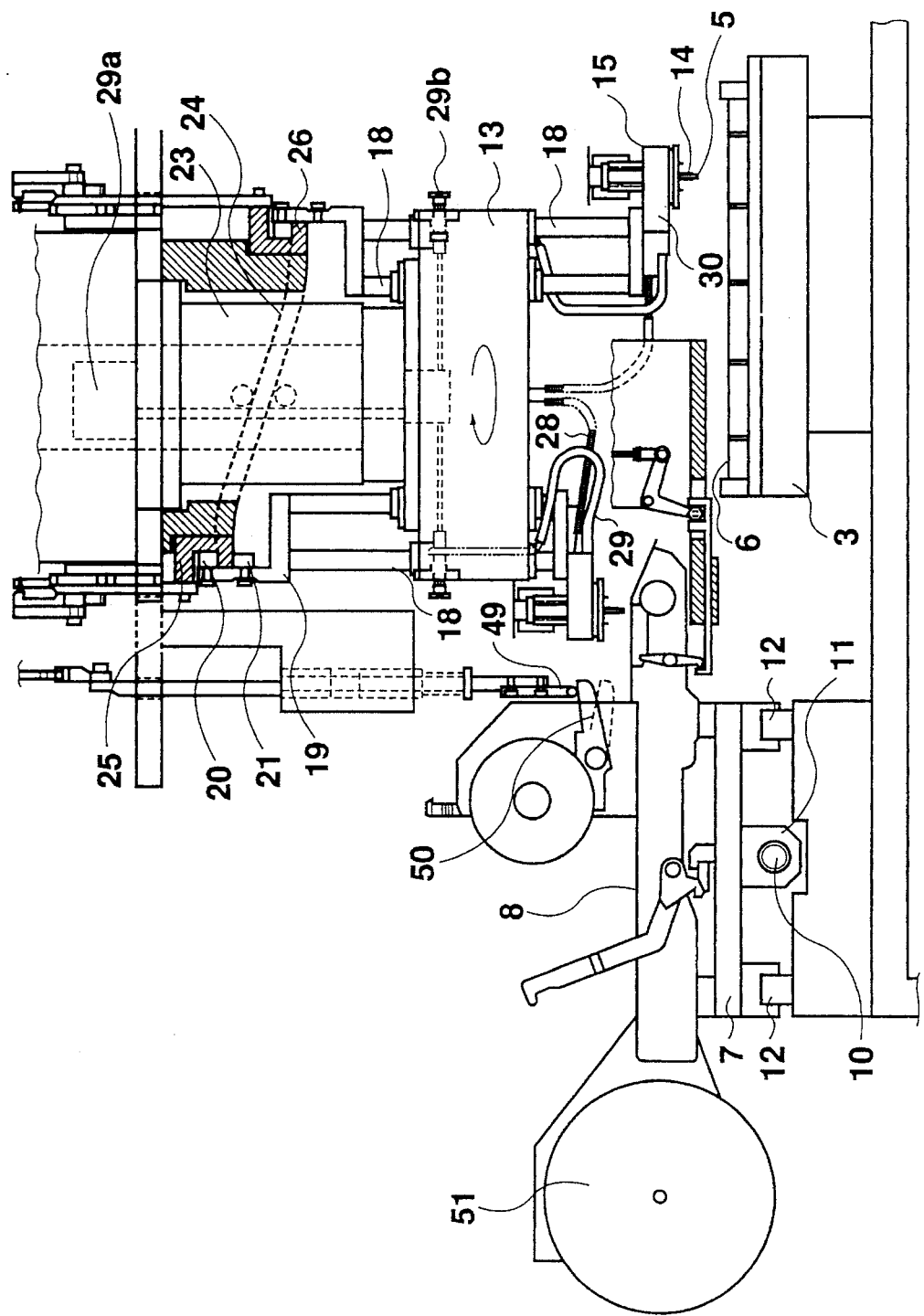
FIG. 2 is a side view showing an automatic electronic parts-mounting apparatus according to this invention.

In FIGS. 1 and 2, a Y table 1 moves in the Y direction by the rotation of a Y-axis motor 2, while an X table 3 moves in the X direction on the Y table 1 by the rotation of an X-axis motor 4. These tables 1 and 3 constitute an XY table for moving a printed substrate 6 mounted on the X table 3 in the XY directions as a part of a parts-mounting station 100.

The printed substrate 6 on which chip-like electronic parts (hereinafter referred to as parts) 5 are mounted is fixed to a fixing means (not shown) on the X table 3. Mean-while, a number of parts feeders 8 for feeding the parts 5 to the feeding base 7 are provided as a parts-adsorbing station 110 at a position opposed to the parts-mounting station 100. The feeding base 7 is moved in the X direction through a ball screw 10 rotated by a feeding base-driving motor 9. Specifically, the feeding base 7 is guided by a linear guide 12 through a ball screw 10 screwed into a nut 11 fixed to the feeding base 7. Further, there is provided a rotary table 13 intermittently rotating as a movable base between the parts-mounting station 100 and the parts-adsorbing station 110. At the outer periphery of the rotary table 13 a plurality of nozzle heads (mounting heads) 15 having six adsorptive nozzles 14 are arranged with an identical interval in accordance with the intermittent pitch of the rotary table 13.

For adsorbing and taking parts 5 out of the parts-feeding device 8 by the adsorptive nozzle 14 in the parts-adsorbing station 110, the nozzle head 15 stops at a stopping position I shown by black point noted at the upper part in FIG. 1. At this stopping position the mounting head 15 goes down in order to enable the adsorptive nozzle 14 to adsorb the parts 5. A parts-recognizing station 120 is provided between the parts-adsorbing station 110 and the parts-mounting station 100.

When the nozzle head 15 having adsorbed the parts 5 at the stopping position II stops by the intermittent rotation of the rotary table 13, the positional deviation of the parts 5 relative to the adsorptive nozzle 14 is recognized by the parts-recognizing device 16.

At the parts-mounting station 100, the nozzle head 15 stops at a stopping position III (shown by black point noted at the lower part in FIG. 1.) for mounting the parts 5 being adsorbed by the adsorptive nozzle 14 on the printed substrate 6. At this position, the nozzle head 15 goes down and the XY table 3 moves so that the parts 5 are mounted on the printed substrate 6 having stopped at a predetermined position.

As shown in FIG. 2, the nozzle head 15 is mounted at the lower part of the head up/down shaft 18 passing through the rotary table 13 at two inner and outer side positions to be movable in the vertical direction. The upper portion of the shaft 18 is fixed to an L-shaped roller-mounting body 19. An upper cam follower 20 and a lower cam follower 21, projecting inwardly, are rotatably mounted at the upper part of the roller-mounting body 19.

Further, as shown in FIG. 2, there is provided a supporting base 23 for supporting the rotary table 13 to be rotatable in the horizontal direction at the lower part, and a cylinder cam 24 is formed at the circumference of the supporting base 23. The cylinder cam 24 is held by the upper and lower cam followers 20 and 21 via a spring (not shown), and in this state the upper part of the nozzle head 15, in a state of being held, will be moved by the rotation of the rotary table 13.

Specifically, the nozzle head 15 vertically moves along the cylinder cam 24, and reaches the highest position at the stopping position I and the lowest position at the stopping position III in FIG. 1.

At the parts-adsorbing station 110 and the parts-mounting station 100, the cylinder cam 24 is shown in a partially cut-out state. The upper and lower cam followers 20 and 21 are then shifted to link with the vertically movable bodies 25 and 26 which vertically move by being driven by a cam (not shown). This vertical movement of the bodies 25 and 26 enables the nozzle head 15 to be vertically movable at each station for parts-adsorption and parts-mounting.

A drive power source cord 28 is connected to the nozzle heads 15 for transmitting currents from a drive circuit 57 mentioned hereafter for driving a pulse motor 31. A vacuum tube 29 is communicated with a vacuum source 29a being a part of an adsorptive mechanism for adsorbing the parts 5 by the adsorptive nozzle 14. The adsorptive mechanism is composed of the vacuum source 29a and a release valve 29b for adsorbing and releasing operations.

Figure 3:
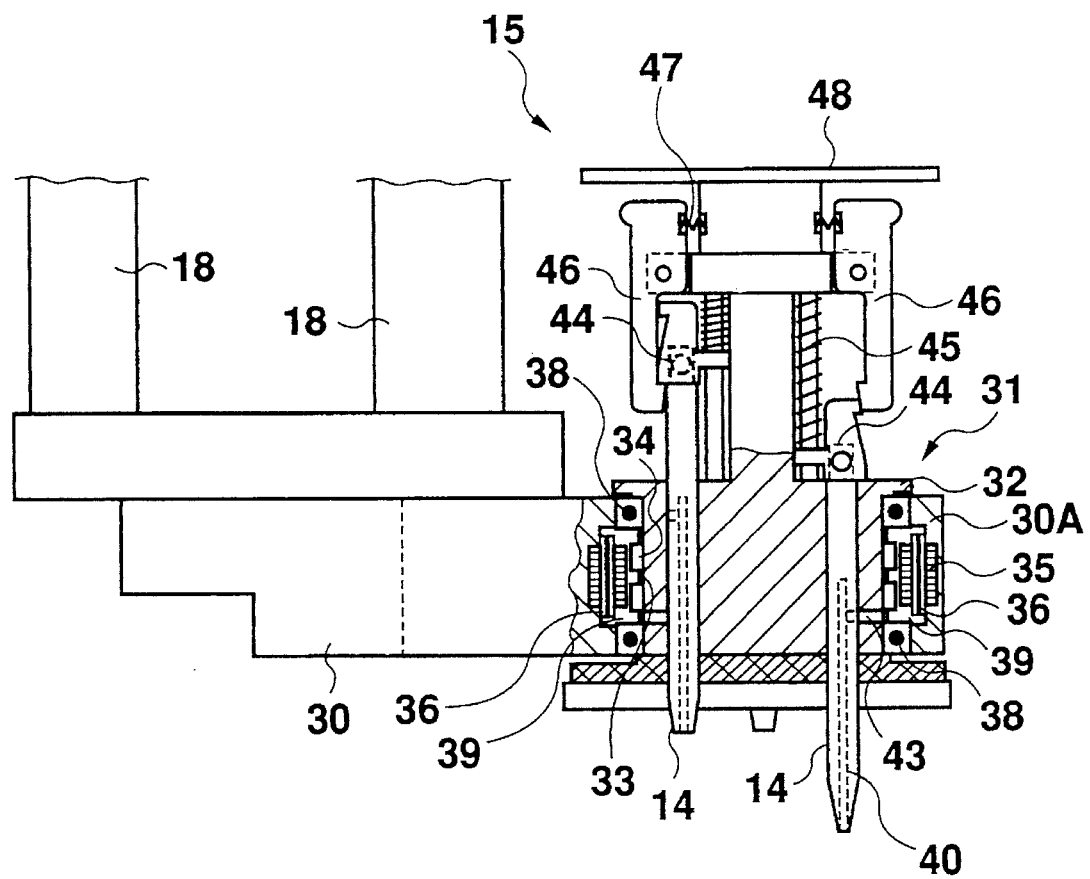
FIG. 3 is a side view of an automatic electronic parts-mounting apparatus according to this invention in which a nozzle head is shown in s partial cross-sectional state.

The nozzle head 15 will now be described with reference to FIG. 3.

A mounting plate 30 made of aluminum is provided at the lower part of the shaft 18. A pulse motor 31 is mounted on the mounting plate 30.

The rotor 32 of the pulse motor 31 is rotatable in the θ direction within the stator 30A formed integrally with the mounting plate 30 and is made of aluminum. A permanent magnet 33 is buried over the entire circumference of the rotor 32, and an iron core 34 to be magnetized by the permanent magnet 33 is provided above and below the magnet 33 at the circumference direction with repeated unevenness. Further, over the entire circumference of the inner wall of the stator 30A, an iron core 35 is mounted. A plurality of parts in the circumference direction of the stator 30A of the iron core 35 are convex in shape, and around which the coil 36 is wound. Pulse currents from the drive power source cord 28 are applied to the coil 36 so that the rotor 32 will rotate by a predetermined angle in accordance with the number of pulses and due to the resiliency of the iron core 34 having been magnetized by the permanent magnet 33. A bearing 38 rotatably supports the rotor 32 relative to the stator 30A. A vacuum room 39 (chamber) being shut out from the atmosphere by the bearing 38 is formed between the rotor 32 and the stator 30A and is communicated with the vacuum tube 29 via the stator 30A. A part of the bearing 38 is shielded to tightly maintain the vacuum state.

The adsorptive nozzles 14 are vertically movable passing through the rotor 32 in the vertical direction respectively, and have vacuum adsorptive holes 40 at their chip. The vacuum adsorptive hole 40 is opened outwardly at an intermediate portion on the side surface of the adsorptive nozzle 14, and is communicated with the vacuum room 39 via a communication hole 43 formed in the rotor 32. At the upper part of the adsorptive nozzle 14 a hook means 44 is formed so as to be urged downwardly by a press spring 45. At the upper part of the rotor 32, there is provided a lever 46 for holding the adsorptive nozzle 14 in a raised state against the press spring 45 to be engaged with an hook means 44 of the adsorptive nozzle 14. The lever 46 is mounted to be urged by the spring 47 so as to pivotally rotate in the axial direction of the rotor 32. By a lever-rotating device 131 as a nozzle-selecting mechanism of a nozzle-selecting station 130 provided downstream of the parts-mounting station 100, the lever 46 is pivotally rotated to open its upper end against the spring 47. As a result, the adsorptive nozzle 14 having been held as shown at the left-hand side in FIG. 3 by the lever 46 would project downwardly as shown at the right-hand side in FIG. 3 in order to be ready for adsorbing the parts 5. Namely, a desired adsorptive nozzle 14 suitable for the shape of the parts 5 to be adsorbed by the lever-rotating device 131 will be selected. In such a state, the vacuum adsorptive hole 40 is communicated with the communication hole 43 to be ready for the vacuum adsorption by the vacuum source. However, if it is maintained in the raised state as shown at the left-hand side in FIG. 3, there will be no communication so that the vacuum adsorption could not be carried out.

Further, as shown in FIG. 1, a nozzle storage station 140 having a contact base 141 is arranged downstream of the parts-mounting station 100. The adsorptive nozzle 14 having projected from other adsorptive nozzles 14 for adsorbing and mounting the parts 5 will be raised up by the contact base 141 against the press spring 45 when passing through the nozzle storage station 140 and is then engaged with the lever 46. In this manner, a plurality of adsorptive nozzles 14 are temporarily stored in the rotor 32. Further, at the upper end of the nozzle head 15 rotary discs 48 having radial slits are provided in accordance with the arrangement of the adsorptive nozzles 14. The rotary discs 48 are connected to the rotor 32 and rotate with the rotor 32. Downstream of the parts-mounting station 100, a rotor position-detecting station 150 having a rotor position-detecting mechanism 151 is provided. At this rotor position-detecting station 150, any error between a predetermined rotor stopping position and that after the electronic parts are mounted is detected by a through-light sensor etc. On the basis of this detected result, controlling operations will be carried out, for example, to rotate the rotor 32 for eliminating the error or not to use the nozzle head having an error in adsorbing the parts the next time.

By virtue of the rotation of the rotor 32, the adsorptive nozzle 14 for adsorbing the parts 5 can be positioned at a desired angular position regardless of whether the rotary table 13 is in a rotating or stopped state.

In FIG. 2, an up/down lever 49 vertically moving for pivotally rotating the pivot lever 50 of the parts feeder 8 pivotally rotates the pivot lever 50 and feeds a tape (not shown) wound around a tape reel 51 to supply parts 5 stored in the tape to the adsorbing position of the adsorptive nozzle 14.

Figure 4:
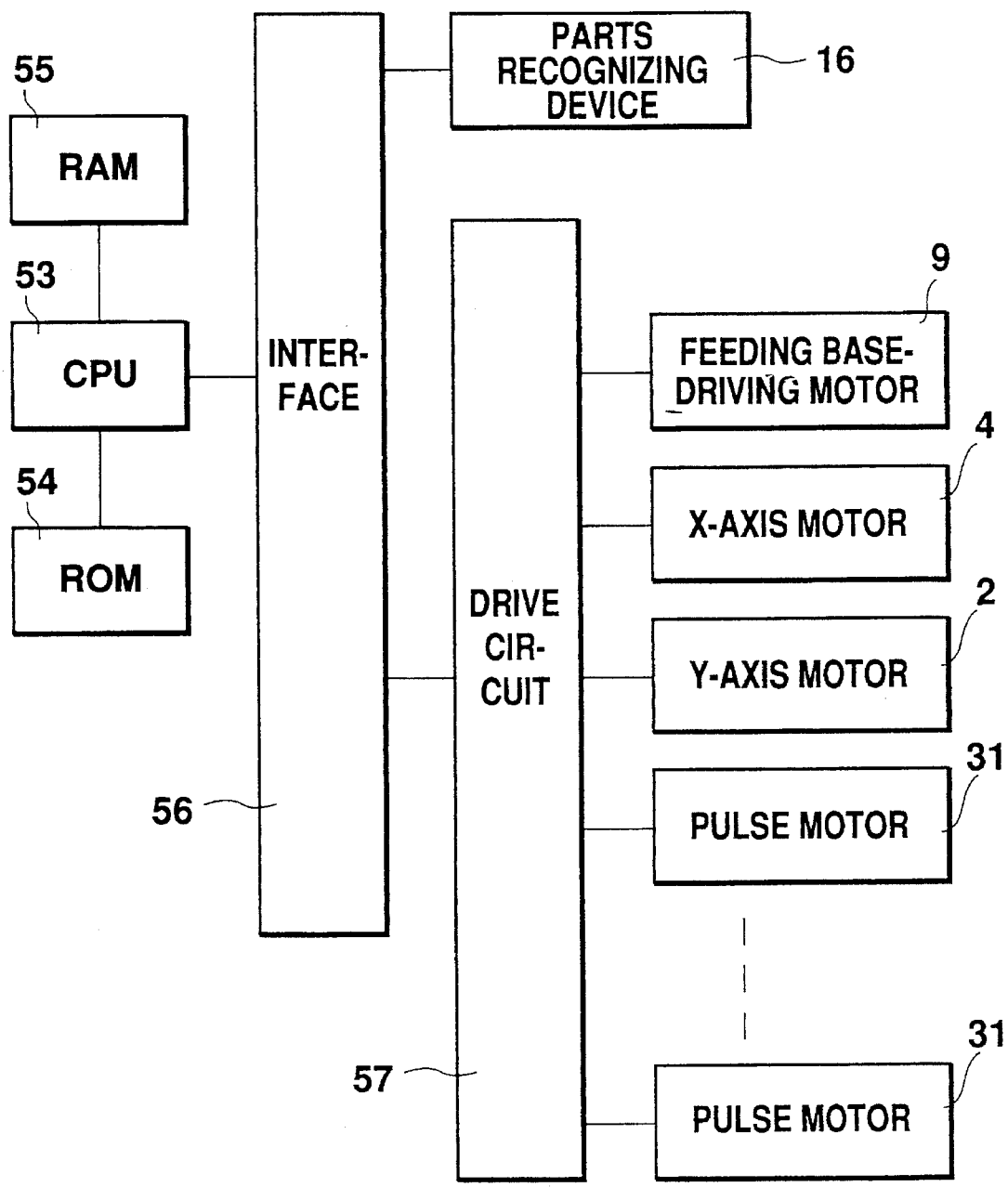
FIG. 4 is a block diagram of an automatic electronic parts-mounting apparatus according to this invention.

In FIG. 4, a CPU 53 reads out data stored in a RAM 55 in accordance with a program stored in a ROM 54 to control a variety of operations relating to the parts-mounting operation. A recognizing device 16 and a drive circuit 57 etc. are coupled to the CPU 53 via an interface 56. The feeding base-driving motor 9 and the pulse motor 31 for the nozzle heads 15 etc. are connected to the drive circuit 57.

Figure 5:
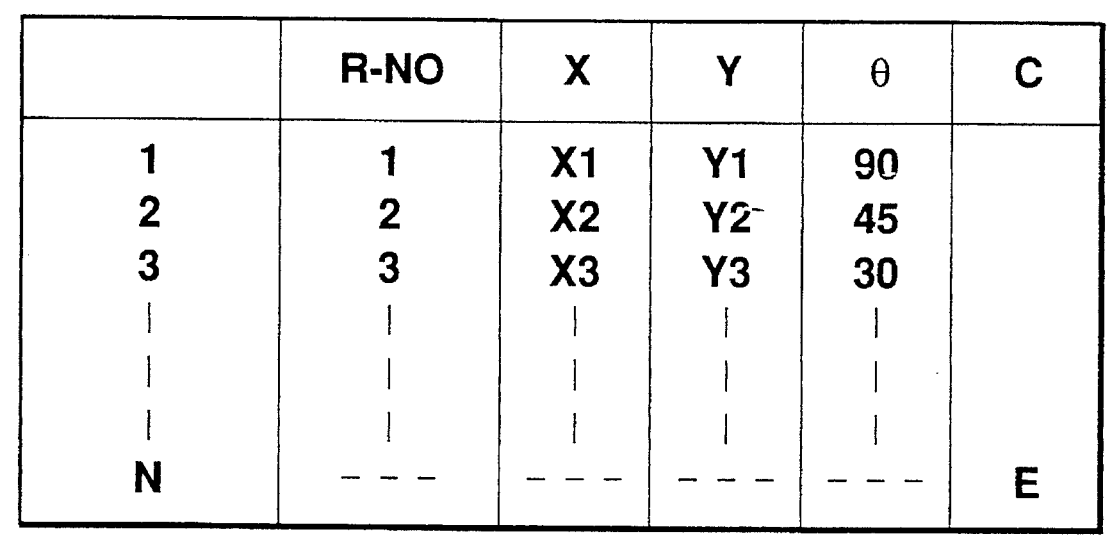

NC data as shown in FIG. 5 are stored in the RAM 55. The NC data are stored in the RAM 55 for each type of printed substrate 6, and the reel number (item represented as "R-NO"), X data (item represented as "X"), Y data (item represented as "Y"), and θ data (item represented as "θ") are stored for each step showing the order for mounting the parts. The reel number stands for the located position of the parts-feeding device 8 of the feeding base 7, the X data and the Y data stand for the XY positional coordinates on the printed substrate 6 for mounting the parts 5, and θ data stand for θ direction in which the chip parts 5 should be mounted, namely an angular amount that the adsorbed parts 5 must be rotated. The "E" in the "C" class represents that the parts-mounting operation for one printed substrate 6 finishes with this step.

In operation, when a starting key, not shown, for automatic operation is depressed, the automatic operation starts. After the printed substrate 6 is mounted and positioned fixedly on the XY table, the parts-mounting operation commences in accordance with the steps of NC data (FIG. 5) on the printed substrate 6.

Namely, the reel number 1 of step 1 is read out, and the parts-feeding device 8 of that reel number rotates the feeding base-driving motor 9 to stop it at the adsorbing position of the adsorptive nozzle 14 for moving the feeding base 7. The rotation of the rotary table 13 enables an adsorptive nozzle suitable for the parts of the parts-feeding device 8 to be selected with the rotation of the pulse motor 31. When the nozzle head 15 projected as shown at the right-hand side of FIG. 3 and having a vacuum hole 40 communicating with a not shown vacuum source reaches the parts-adsorbing station 110, the nozzle head 15 goes down with the vertical moving body 25 which vertically moves by being driven by a cam (not shown). The parts feeder 8 feeds the parts 5 to the adsorptive position by the pivotal lever 50 pivotally rotating by the downward movement of the up/down lever 49. Thus, the parts 5 having been fed out by the adsorptive nozzle 14 will be adsorbed.

When the nozzle head 15 moves to reach the parts-recognizing station 120 by the intermittent rotation of the rotary table 13, the parts-recognizing device 16 recognizes the parts 5 having been adsorbed by the adsorptive nozzle 14.

Subsequently, the nozzle head 15 moves from the parts-recognizing station 120 by the rotation of the rotary table 13. At this time, if it has been recognized from the result of the parts-recognizing device 16 that there is an angular deviation of $\Delta\theta$, the CPU orders the drive circuit 57 to rotate the rotor 32 by an angle of "90 −$\Delta\theta$" which is a sum of 90 degrees of θ data of the NC data and the positional deviation. The drive circuit 57 outputs pulse currents corresponding to that angle to the pulse motor 31. As a result, the rotor 32 of the pulse motor 31 rotates by an angle of "90–$\Delta\theta$", the adsorptive nozzle 14 rotates just by the rotating amount of the rotor 32 with a slight transmission loss for accurately adjusting to the angular position of 90 degrees. This rotation can finish before the intermittent rotation of the rotary table 13 stops, or can continue to complimentarily rotate even after the intermittent rotation of the rotary table 13 stops.

Next, when the nozzle head 15 reaches the parts-mounting station 100, the nozzle head 15 goes down in the same manner as the parts-adsorbing station 110 does, so that the parts 5 are mounted with a mounting angle of 90 degrees at the coordinate position of (X1, Y1) of the printed substrate 6. For accurately mounting the parts 5 at that position, the XY table rotate the X-axis motor 4 and the Y-axis motor 2 to correct the positional deviation in accordance with the adsorptive nozzle 14 having rotated by "90–$\Delta\theta$" on the basis of the recognized result of the recognizing device 16. Thereafter, the vacuum tube 29 is released or air is supplied to the vacuum tube 29 for mounting the parts 5.

Next, the contact base 141 of the nozzle storage station 140 arranged before the parts-mounting station 110 acts to move up all the adsorptive nozzles 14 of the nozzle head 15. Further, the rotor position-detecting station 150 detects the position of the rotor to carry out the aforementioned predetermined process. Thereafter, the adsorptive nozzle 14 to be used for parts-mounting is selected by the nozzle-selecting station 130 and is rotated by the pulse motor 31. Then only the adsorptive nozzle 14 to be used is released from the engagement with the lever 46 by rotating the lever 46 by the lever-rotating device 131 so that the spring 45 causes the adsorptive nozzle 14 to downwardly project. After that, the rotary table 13 is rotated to position the adsorptive nozzle 14 at a position where the parts can be adsorbed from the parts-feeding device 8.

The operation to adsorb the parts 5 at step 2 is carried out by the adsorptive nozzle 14 of the nozzle head 15 reaching the parts-mounting station 110 after the nozzle head 15 having the adsorptive nozzle 14 has adsorbed the parts at step 1.

Thus, the parts-adsorbing and mounting operations are performed by each head in order of steps of the NC data.

In this embodiment, the motor having the rotor 32 through which the adsorptive nozzle 14 passes has been a pulse motor, but alternatively it is also possible to use a servo motor for rotary-positioning by feed-back control to adjust to the position near the encoder and containing an encoder for detecting a rotating position and the adsorptive nozzle is mounted passing through the rotor.

Figure 6:
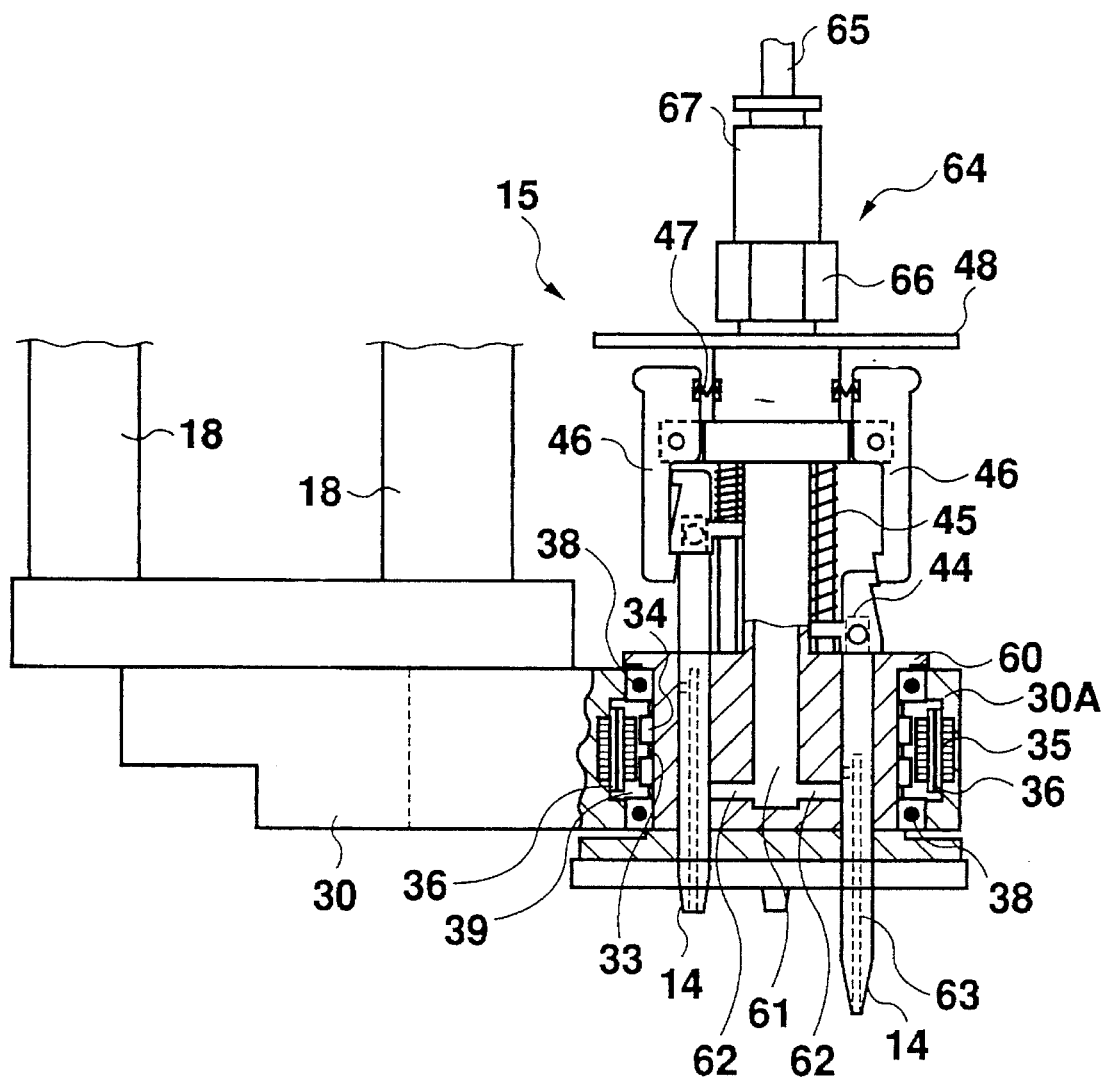
FIG. 6 is a side view of an automatic electronic parts-mounting apparatus according to this invention in which a nozzle head is shown in a partial cross-sectional state.

Further, in this embodiment, the vacuum adsorptive hole 40 of the adsorptive nozzle 14 has been communicated with the vacuum source via the vacuum room 39 formed between the rotor 32 and the stators 30A, but it is also possible to compose it as shown in FIG. 6 as another embodiment.

Namely, a vacuum path 61 is formed in the vertical direction being the axial direction of the rotor 60 within the rotor 60. A nozzle communicating path 62 is formed toward the adsorptive nozzles 14 from the vacuum path 61, the communicating path 62 being opened at the side surface of the rotor 60. On the other hand, a vacuum adsorptive hole 63 is formed in the axial direction within the adsorptive nozzle 14 having one end opened at the adsorptive surface of the parts 5 and the other opened toward the rotor 60 side at the side surface of the body of the nozzle 14. As shown at the right-hand side of FIG. 6, if the adsorptive nozzle 14 is projected at a position where it is capable of taking out the parts 5, the opening of the side surface of the nozzle 14 communicates with the nozzle communicating path 62. Meanwhile, if the nozzle 14 is not used and the hook means 44 is held and stored by the lever 46 as shown at the left-hand side of FIG. 6, the opening does not communicate with the nozzle communicating path 62, which is shielded at the side surface of the nozzle 14 for maintaining the vacuum state.

The vacuum path 61 is communicated with a tube 65 via a rotary joint 64 as a rotary mechanism at the upper part of the rotor 60. The rotary joint 64 is composed of a rotary end 66 having a hollow portion (not shown) and a fixed end 67 having a hollow portion (not shown) and provided through a ball bearing (not shown) to be relatively rotatable. The hollow portions are mutually communicated, and the connecting portion of the fixed end 67 with the rotary end 66 is sealed by a not shown seal to maintain the vacuum state. The rotor 60 is fixed to the rotary end 66 with its vacuum path 61 communicating with a hollow portion (not shown), and the tube 65 is connected to the fixed end 67 and communicated with the hollow portion(not shown). Thus, even if the rotor 60 is rotated, the tube 65 does not rotate or twist to enable coupling of a vacuum pass route.

In FIG. 6, the structures with the same numerals as in the first embodiment are the same as in the first embodiment so they will be omitted from description.

It is also possible to provide a dust-bastering filter to prevent any dust from entering the vacuum adsorptive hole 40 of the adsorptive nozzle 14.

Further, the adsorptive nozzle 14 passes through the rotor 32 upwardly in this embodiment. However, it is also possible, if there is a space in the rotor for vertical movement without its upper end being upwardly projecting, for it to be locked at the upper and lower position without upwardly projecting.

Furthermore, if it is constructed such that the adsorptive nozzle 14 can be stored within the rotor 32 as this embodiment, the inertia of the adsorptive nozzle portion can be reduced in comparison with a case where the rotor is further downwardly extended and a head section having a movable vertically adsorptive nozzle is provided. Accordingly, even when high-speed positioning is required, the rotation of the motor can be transmitted accurately and the object to be rotated can be light-weight. Moreover, since the stator portion can be composed to be light-weight, since its required driving force can be small. As a result, the total weight of the head can be reduced, and the weight to be mounted on the rotary table can be light-weight. Or, even if a significantly heavy motor must be used for performing accurate positioning, the total head weight can be reduced in comparison with a case where the rotor is downwardly extended for forming the head, so that a more accurate motor can be used with the same weight.

Furthermore, according to this embodiment, a plurality of adsorptive nozzles 14 have been mounted on the rotor 32 of the nozzle head 15, however, it is also possible to use just one nozzle, and to mount it at a position deviated from the rotating center of the rotor or at the center of the rotation without any deviation.

When a plurality of adsorptive nozzles are mounted on the mounting head to be vertically movable, the motors can be mounted to the head for each adsorptive nozzle so that each motor can rotate the individual adsorptive nozzle respectively.

What is claimed is:

1. An automatic electronic parts-mounting apparatus for mounting electronic parts supplied from a parts feeder at predetermined positions on a printed substrate, said apparatus comprising:

an adsorptive nozzle for adsorbing the electronic parts one by one;

an adsorptive mechanism for adsorbing and releasing the electronic parts to and from the adsorptive nozzle;

a parts-adsorbing station for holding the electronic parts supplied from the parts feeder;

a parts-recognizing unit for recognizing the state of the electronic parts being adsorbed by the adsorptive nozzle in said parts-adsorbing station;

a parts-mounting station for holding the printed substrate on which the electronic parts adsorbed by the adsorptive nozzle are to be mounted;

a nozzle head having a nozzle-rotating motor for correcting the position of the adsorbed electronic parts by rotating said adsorptive nozzle within a plane being perpendicular to a nozzle axis of said adsorptive nozzle in accordance with the adsorbed state of the electronic parts recognized by said parts-recognizing unit, the nozzle-rotating motor including a stator and a rotor, wherein at least two adsorptive nozzles are provided at the outer periphery of the rotor, and each adsorptive nozzle is capable of moving toward and away from the rotor;

a movable nozzle base containing said nozzle head for sequentially moving said nozzle head toward said stations; and a head up/down mechanism for vertically moving said nozzle head, said head up/down mechanism moved to a predetermined position toward an adsorbing position or a releasing position of the electronic parts.

2. The automatic electronic parts-mounting apparatus according to claim 1, wherein said movable base is a rotary table having a plurality of nozzle heads around the peripheral edge thereof, and a parts-recognizing unit is disposed in a parts-recognizing station to which the electronic parts are sequentially carried by rotation of said rotary table.

3. The automatic electronic parts-mounting apparatus according to claim 1, wherein the rotor and the stator form a gap therebetween as a vacuum chamber capable of being made vacuum or non-vacuum state by said adsorptive mechanism, and said adsorptive nozzle is a vacuum which becomes communicated with a vacuum adsorptive hole of said adsorptive nozzle only when the adsorptive nozzle is adsorbing and holding the electronic parts.

4. The automatic electronic-parts mounting automatic electronic parts-mounting apparatus according to claim 1, wherein the rotor and the stator form a gap therebetween as a vacuum chamber capable of being made vacuum or non-vacuum state by said adsorptive mechanism, and said adsorptive nozzle is a vacuum chamber which becomes communicated with a vacuum adsorptive hole of said adsorptive nozzle only when the adsorptive nozzle is adsorbing and holding the electronic parts.

5. The automatic electronic parts-mounting apparatus according to claim 1, wherein the stator is provided around the rotor; and a vacuum path is formed inside the rotor to be capable of being made vacuum or non-vacuum by said adsorptive mechanism and of communicating with a vacuum adsorptive hole of said adsorptive nozzle only when said adsorptive nozzle is adsorbing and holding the electronic parts.

6. The automatic-parts mounting apparatus according to claim 3, wherein the stator is provided around the rotor; and a vacuum path is formed inside the rotor to be capable of being made vacuum or non-vacuum state by said adsorptive mechanism and of communicating with a vacuum adsorptive hole of said adsorptive nozzle only when said adsorptive nozzle is adsorbing and holding the electronic parts.

7. The automatic electronic-parts mounting apparatus according to claim 1, said electronic-parts mounting apparatus further comprising:

a nozzle storage station having a contact base provided downstream of said parts-mounting station, the contact base of said nozzle storage station contacting with one of said adsorptive nozzles, provided in said nozzle head, which is outstanding for adsorbing and mounting the electronic parts so as to store said adsorptive nozzle within the rotor.

8. The automatic electronic parts-mounting apparatus according to claim 7, wherein said movable base is a rotary table having a plurality of nozzle heads around the peripheral edge thereof, and a parts-recognizing unit is disposed in a parts-recognizing station to which said nozzle heads are sequentially carried by rotation of said rotary table.

9. The automatic electronic parts-mounting apparatus according to claim 7, said electronic parts-mounting said apparatus further comprises:

a nozzle-selecting station provided downstream of the nozzle storage station and having a nozzle-selecting mechanism for selecting one, among the plurality of adsorptive nozzles stored inside the rotor, which is suitable to be applied to the electronic parts.

10. The automatic electronic parts-mounting apparatus according to claim 9, wherein said movable base is a rotary table having a plurality of nozzle heads around a peripheral edge thereof, and the part-recognizing unit is disposed in a parts-recognizing station to which said nozzle heads are sequentially carried by rotation of said rotary table.

11. The automatic electronic parts-mounting apparatus according to claim 1, said electronic parts-mounting apparatus further comprising:

a rotor position-detecting station provided downstream of said parts-mounting station and having a rotor position-detecting mechanism for detecting and outputting an error between a predetermined rotor-stopping position and a rotor-stopping position after the electronic parts have been mounted.

12. The automatic electronic parts-mounting apparatus according to claim 11, wherein said movable base is a rotary table having a plurality of nozzle heads around a peripheral edge thereof, and the parts-recognizing unit is disposed in a parts-recognizing station to which said nozzle heads are sequentially carried by rotation of said rotary table.

* * * * *